United States Patent [19]
Cantrell et al.

[11] Patent Number: 5,252,782
[45] Date of Patent: Oct. 12, 1993

[54] APPARATUS FOR PROVIDING RFI/EMI ISOLATION BETWEEN ADJACENT CIRCUIT AREAS ON A SINGLE CIRCUIT BOARD

[75] Inventors: Gregory A. Cantrell, Mesquire; Paul V. Marshall, Garland; David L. Parks, Dallas, all of Tex.

[73] Assignee: E-Systems, Inc., Dallas, Tex.

[21] Appl. No.: 905,305

[22] Filed: Jun. 29, 1992

[51] Int. Cl.⁵ .................................................. H05K 9/00
[52] U.S. Cl. ................................... 174/35 R; 361/818
[58] Field of Search ........... 174/35 R, 35 MS, 35 GC, 174/261, 262; 361/390, 391, 392–395, 397, 399, 400, 401, 412, 415, 424

[56] References Cited

U.S. PATENT DOCUMENTS

| | | | |
|---|---|---|---|
| 4,739,453 | 4/1988 | Kurokawa | 361/424 |
| 4,831,498 | 5/1989 | Baba | 361/424 |
| 5,014,160 | 5/1991 | McCoy, Jr. | 361/424 |
| 5,045,971 | 9/1991 | Ono et al. | 361/386 |
| 5,107,404 | 4/1992 | Tam | 361/424 |

OTHER PUBLICATIONS

C. E. Dexter, "Design Considerations for Miniaturized Receivers", Watkins-Johnson Company, Tech-Notes, vol. 16, No. 5, Sep./Oct. 1989.

*Primary Examiner*—Leo P. Picard
*Assistant Examiner*—Bot Ledynh
*Attorney, Agent, or Firm*—Harold E. Meier

[57] ABSTRACT

A sensitive circuit area on a circuit board is isolated from an adjacent located non-sensitive circuit area by surrounding the sensitive circuit area with electrically interconnected ground planes positioned on the opposite sides of the circuit board. The isolation system further includes a "clam shell" RF/IF tight shield attached to each side of the circuit board enclosing the sensitive circuit area. A partially conductive gasket is placed between the clam shell and the top and bottom circuit board surfaces to enhance isolation performance.

22 Claims, 4 Drawing Sheets

5,252,782

APPARATUS FOR PROVIDING RFI/EMI ISOLATION BETWEEN ADJACENT CIRCUIT AREAS ON A SINGLE CIRCUIT BOARD

TECHNICAL FIELD

The present invention relates to the isolation of sensitive and non-sensitive circuits from propagating interference energy and, in particular, to RFI/EMI isolation of circuit areas fabricated adjacent to each other on a single circuit board.

BACKGROUND OF THE INVENTION

Many circuit designs include both digital and analog circuits. For example, a digitally controlled radio contains both an analog circuit (comprised of radio frequency (RF) and intermediate frequency (IF) circuits), and a digital circuit for controlling the operation of the analog RF/IF portions of the radio. Mixed circuit designs are highly susceptible to both cross-talk between the analog and digital circuits and RF/IF signal degradation in the analog circuit due to digital noise. Accordingly, such mixed circuit designs have been implemented on multiple circuit boards shielded from each other to minimize the occurrence of radio frequency interference (RFI) and electromagnetic interference (EMI). However, the installation of the separate circuit boards for the analog and digital circuits in different housings interconnected with shielded and/or filtered cables provides an unsatisfactory solution to RFI/EMI interference concerns in view of the increased costs associated with multi-board fabrication, interconnection and housing.

With the advent of integrated circuit and microcircuit technologies, it has become increasingly possible and important to fabricate mixed circuit designs on a single circuit board or card. Shielding of the circuits continues to be a significant concern. In one shielding method, the analog and digital circuits are fabricated on a single card with an isolation zone placed therebetween to separate the mixed circuits from each other and provide some RFI/EMI isolation. While use of an isolation zone obviates the need to manufacture and interconnect multiple circuit boards, this isolation method is unsatisfactory because an isolation zone inefficiently utilizes the limited available space on the circuit board. In another shielding approach, the analog and digital circuits are fabricated on different circuit boards placed within the separated and isolated sections of an "egg carton" circuit card holder. This method successfully provides a single, space efficient "circuit card" for the mixed circuit design, but from a fabrication standpoint is undesirable due to the added costs associated with fabricating the egg carton and the multiple circuit boards that are inserted therein and must be interconnected for circuit operation.

In view of the foregoing, there is a need for an effective and efficient isolation system that will enable both digital and analog circuit areas to be placed adjacent to each other on a single circuit board without cross-talk or RF/IF signal degradation. Such an isolation system should also enable circuit areas operating at different frequencies to be adjacently fabricated.

SUMMARY OF THE INVENTION

The present invention provides a single board RFI/EMI isolation system comprised of a pair of electrically connected ground planes mounted to the opposed surfaces of the circuit board for inhibiting propagation of interference energy through the circuit board. The opposed ground planes are selectively shaped and positioned to surround a sensitive circuit area. A plurality of periodically spaced conductors extending through the circuit board electrically interconnect the opposed ground planes. The RFI/EMI isolation system further includes a "clam shell" RF/IF tight shield for enclosing the sensitive circuit area on each side of the circuit board for inhibiting propagation of interference energy through the air. A conductive gasket is further included on each side of the circuit board between the clam shell and the surface of the circuit board to enhance the RFI/EMI isolation provided.

BRIEF DESCRIPTION OF THE DRAWINGS

A more complete understanding of the RFI/EMI isolation apparatus of the present invention may be had by reference to the following Detailed Description in conjunction with the accompanying Drawings wherein.

DETAILED DESCRIPTION OF THE DRAWINGS

For well known economic manufacturing reasons, it is highly desirable to place all the components for a given circuit design on a single circuit board. Such circuit designs, however, are often mixed circuit designs including both analog and digital circuits and components. As is known, cross-talk, RF/IF degradation due to digital noise and other RFI/EMI problems often occur when interference sensitive circuit areas, typically containing analog circuit components, and non-sensitive circuit areas, typically containing digital circuit components, are placed in close proximity to each other. It will, of course, be understood that RFI/EMI problems may also exist between closely positioned analog circuits operating at different frequencies. These RFI/EMI concerns are magnified when the components in sensitive and non-sensitive circuit areas are placed adjacent to each other on the same circuit board.

Figure 1A:
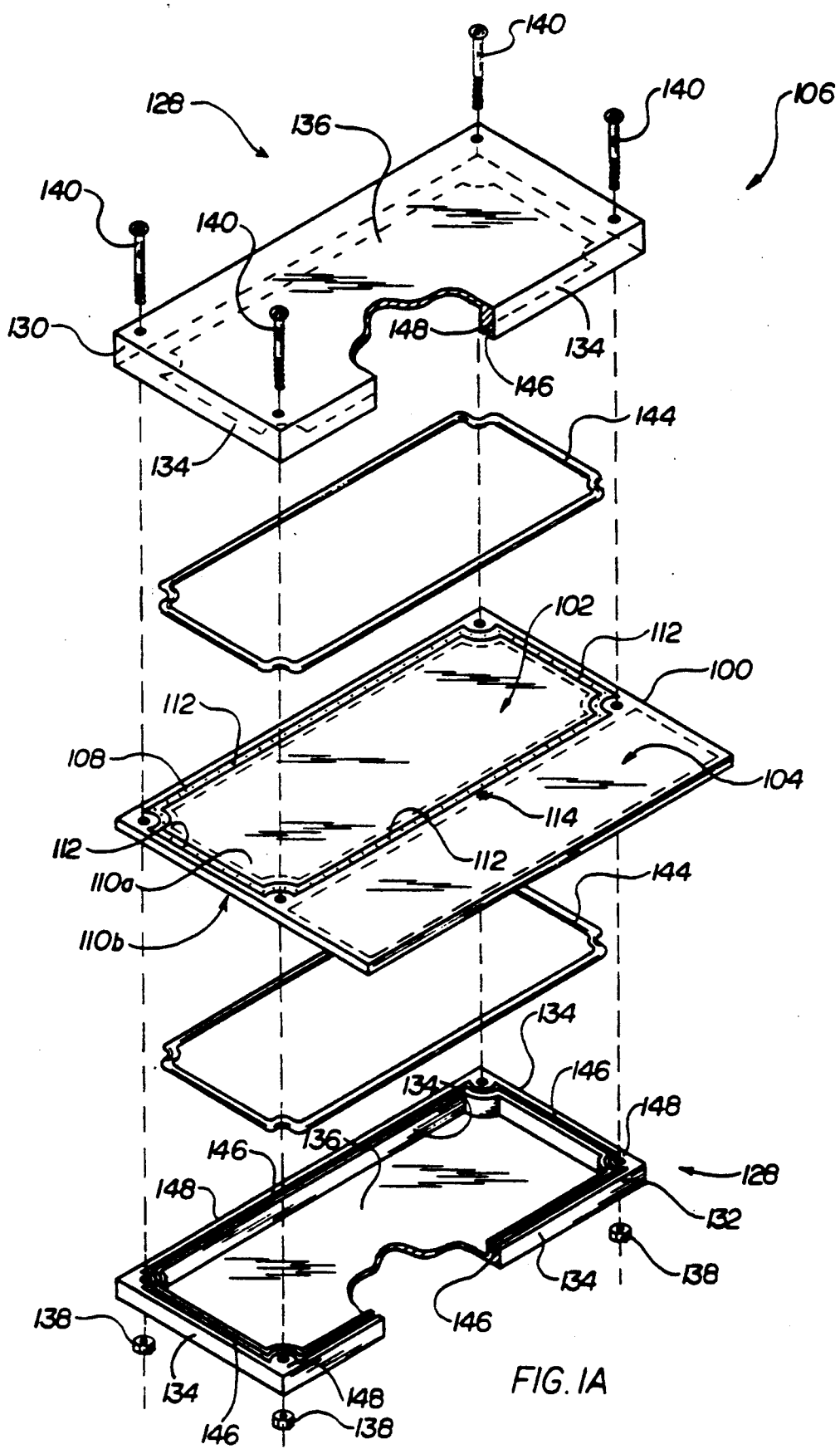
FIG. 1A is an exploded perspective view of the isolation apparatus of the present invention.
Figure 1B:
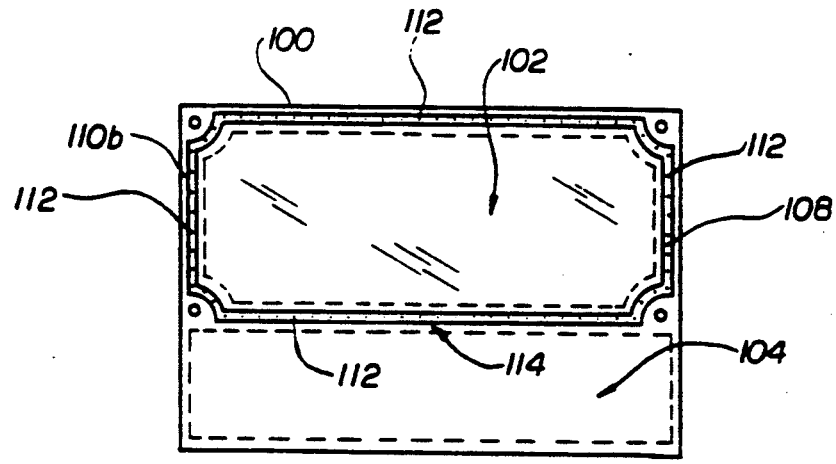
FIG. 1B is a bottom view of the circuit board shown in FIG. 1A.

Reference is now made to FIGS. 1A and 1B, wherein there is shown a circuit board 100 upon which circuits and components (not shown) for implementing a given mixed circuit design are mounted. With a mixed circuit design, the circuit board will include both RFI/EMI sensitive circuit areas 102, typically containing analog circuit components, and non-sensitive circuit areas 104, typically containing digital circuit components, located adjacent to each other. The perimeter of the sensitive and nonsensitive circuit areas, 102 and 104, are generally identified on the circuit board 100 by broken lines. FIG. 1A also shows, in an exploded perspective view, the RFI/EMI analog-digital isolation apparatus 106 of the present invention for isolating the adjacent sensitive circuit areas 102 from the non-sensitive circuit areas 104.

In order to effectively isolate (or shield) adjacent sensitive circuit areas 102 from non-sensitive circuit areas 104 on a circuit board 100, two related RFI/EMI concerns must be addressed. The first concern is preventing propagation of RF energy, or other interference causing energy, through the circuit board 100 between the sensitive area 102 and the non-sensitive area 104. The second concern is preventing propagation of RF energy, or other interference causing energy, through the air surrounding the circuit board 100 between the sensitive area 102 and the non-sensitive area 104.

Figures 2A, 2B:
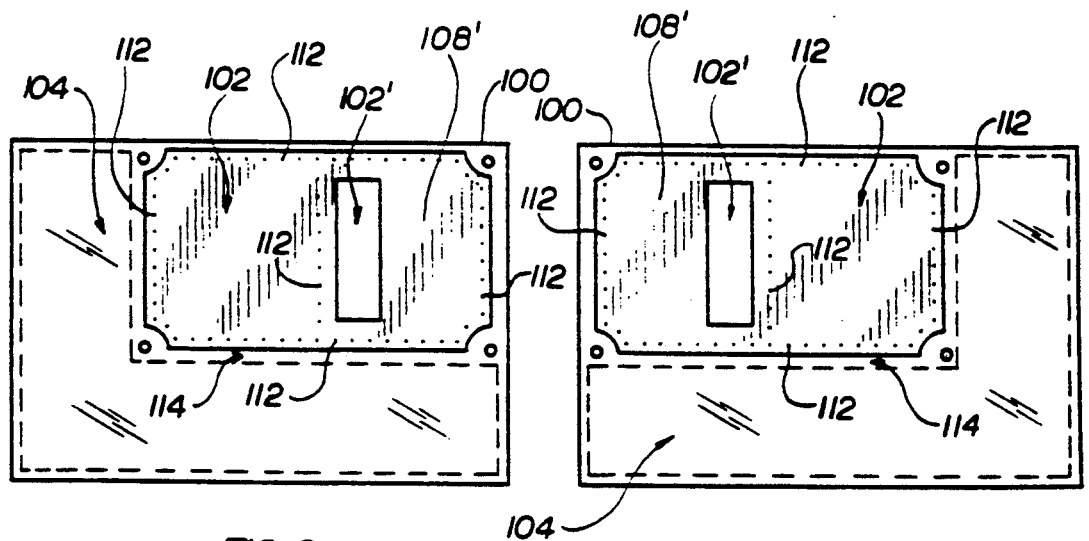
FIGS. 2A and 2B are top and bottom views of a circuit board showing the opposed, electrically tied planar sheet ground planes surrounding a sub-area of the sensitive circuit area.

To address the through the circuit board 100 isolation concern, the isolation apparatus 106 of the present invention includes a pair of electrically tied ground plates 108 covering the opposed top and bottom surfaces, 110a and 110b, respectively, of the circuit board 100. The opposed ground planes 108 are shaped and positioned to surround each sensitive circuit area 102. FIGS. 1A and 1B illustrate linear strip opposed ground planes 108 surrounding a sensitive area 102. It will, of course be understood that the linear strip ground planes 108 may take on a curved shape to surround areas 102 that are not substantially rectangular (for example, a circular area, if desired). FIGS. 2A and 2B illustrate a pair of planar sheet opposed ground planes 108' covering an area surrounding a sub area 102' within the sensitive circuit area 102.

Figure 3:
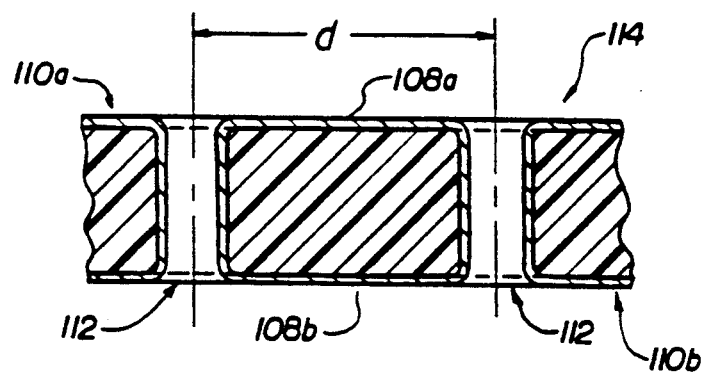
FIG. 3 is a cross-sectional view through a portion of the opposed isolation ground planes of the present invention mounted to a circuit board.

The opposed ground planes 108 are electrically interconnected by means of a plurality of conductively lined apertures 112 extending through the circuit board 100 between the top ground plane 108a and the bottom ground plane 108b. A cross-sectional view illustrating the use of conductively lined apertures 112 for electrically connecting the opposed ground planes 108 is shown in FIG. 3. The apertures 112 are periodically positioned with a predetermined inter-aperture spacing d, chosen as a function of the anticipated wavelength of the RF energy propagating through the circuit board 100, according to the following equation:

$$d = 0.002 * \lambda$$

wherein: $\lambda$ = wavelength of RF energy.

The plurality of spaced apertures 112 establish, in conjunction with the top and bottom ground planes 108, a screen, as generally indicated at 114, to inhibit propagation of the interference energy through the circuit board 100 between the circuit areas 102 and 104. It will, of course, be understood that the electrical connection between the opposed ground planes 108 may alternatively be provided by other conductive interconnection means, such as a conductive via, extending through the circuit board 100. With respect to the planar sheet ground planes 108' shown in FIGS. 2A and 2B, the apertures 112 may be positioned about the perimeter of the ground plane, the perimeter of the sub-area 102' and/or any other location within the area 102 as desired.

Figure 4A:
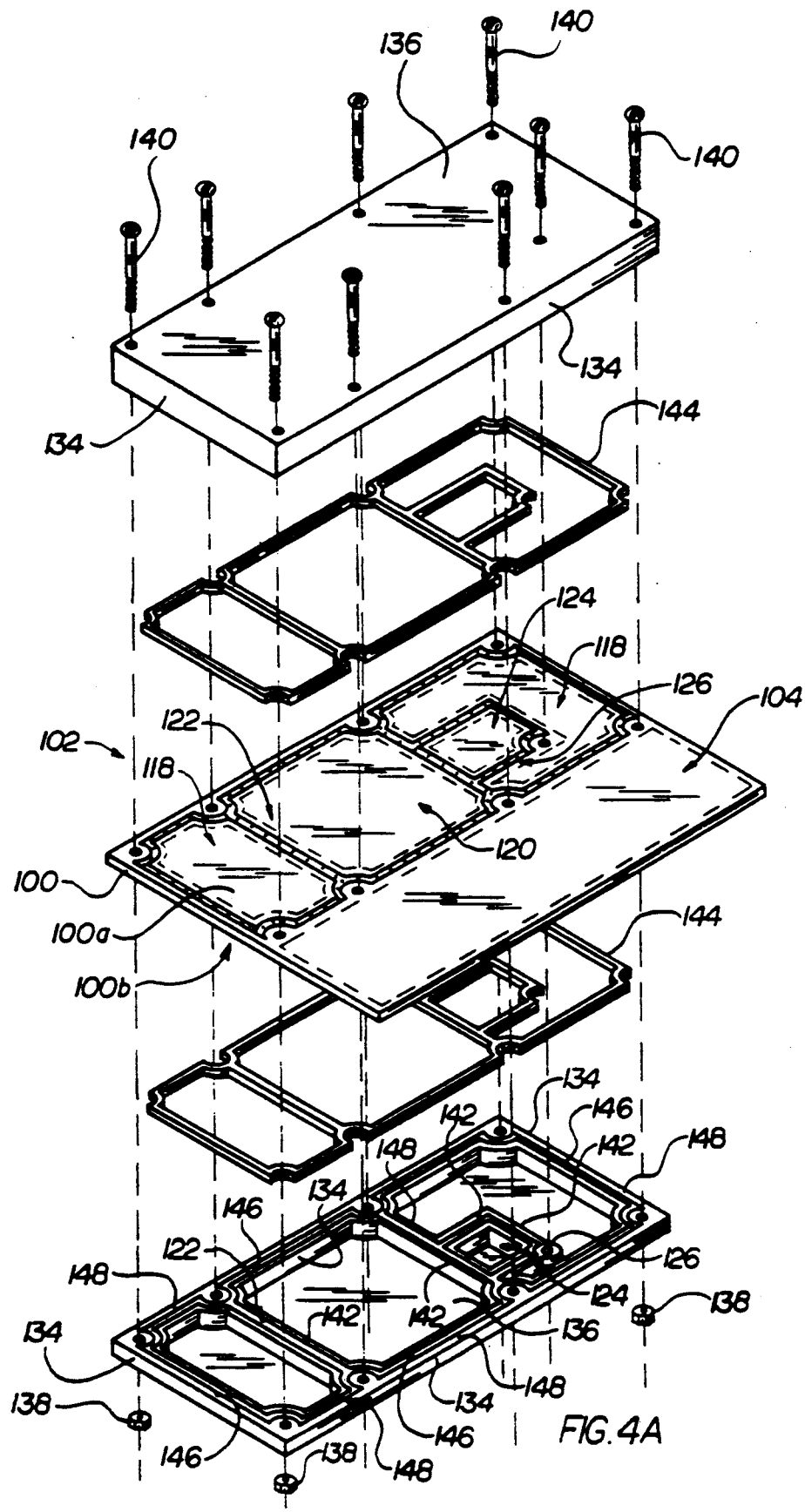
FIG. 4A is an exploded perspective view of the isolation apparatus showing the use of interior clam shell isolation walls corresponding to the sensitive sub-areas of the sensitive circuit area divided by the opposed ground planes.
Figure 4B:
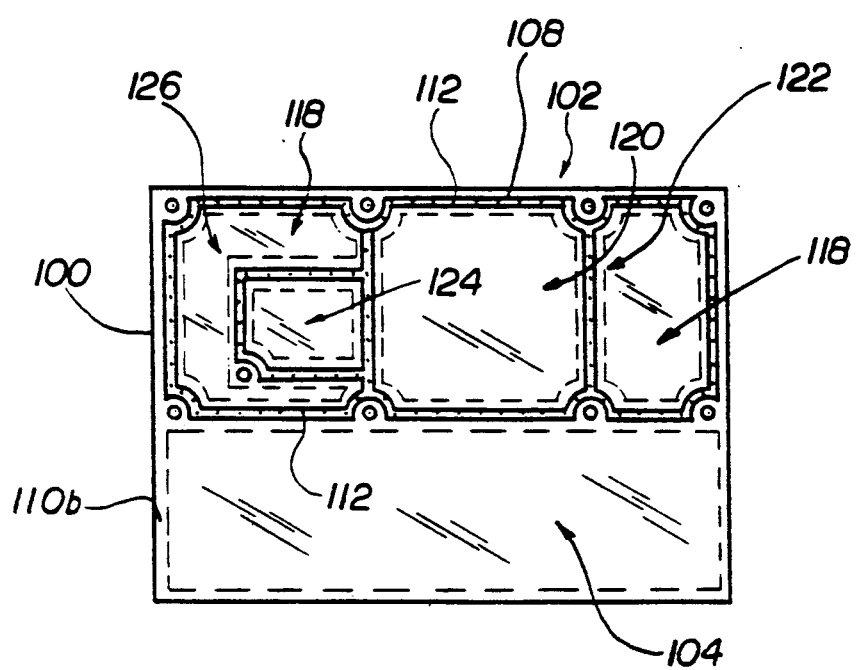
FIG. 4B is a bottom view of the circuit board shown in FIG. 4A.

Often, there is a need, within a sensitive circuit area 102, to isolate one portion (or sub-area) 118 of the sensitive circuit area from another portion (or sub-area) 120 and/or 124, as illustrated in FIGS. 4A and 4B. The opposed, electrically tied ground planes 108 may be used for such isolation by either dividing the sensitive area 102, as generally indicated at 122, or surrounding a sub-area 124 within the sensitive circuit area, as generally indicated at 126. In the case of the surrounded sub-area 124, improved isolation performance may be provided if the ground plane 108 surrounding the area 124 is electrically connected to the ground plane surrounding the sensitive area 102. Such sub-area isolation is also provided by the opposed planar sheet ground planes, with respect to the area 102', in the manner illustrated by FIGS. 2A and 2B.

Referring again to FIG. 1A, to address the airborne interference propagation concern discussed above, the isolation apparatus 106 of the present invention further includes a "clam shell" shield 128 fabricated of a conductive material for providing an RF/IF tight shield enclosing the sensitive circuit area 102. The clam shell shield 128 is comprised of an upper half shell shield 130 and a lower half shell shield 132. Each half shell of the clam shell shield 128 is comprised of a peripheral vertical wall 134 supporting a horizontal roof 136. Although the upper and lower halves (130 and 132) of the clam shell 128 are illustrated as unitary bodies, it will, of course, be understood that the roof 136 may be manufactured and secured separate and apart from the peripheral wall 134 to facilitate access to the components (not shown) mounted to the circuit board 100.

The upper and lower halves of the clam shell shield 128 are attached to the top and bottom surfaces, 110a and 110b, respectively, of the circuit board 100 by means of a plurality of nuts 138 and bolts 140 extending through holes in the half shells (130 and 132) and the circuit board. Other equivalent attachment means for securing the clam shell 128 to the circuit board 100 may be substituted for the nut 138 and bolt 140. The peripheral vertical wall 134 of each half shell corresponds to and aligns with the opposed ground planes 108 surrounding the sensitive circuit area 102 when the clam shell 128 is attached to the circuit board. Furthermore, the vertical wall 134 for the upper half shell 130 is typically fabricated taller than the vertical wall for the lower half shell 132 to provide clearance for the electrical components and circuits (not shown) mounted to the top surface 110a of the circuit board 100 within the sensitive circuit area 102.

If there is a need, within a sensitive circuit area 102 on a circuit board 100, to isolate one portion 118 of the sensitive circuit area from another portion 120, the upper and lower halves of the clam shell 128 may further include one or more interior vertical walls 142 as shown in FIG. 4A. The interior walls 142 of the half shells correspond to the opposed ground planes 108 either dividing the sensitive circuit area 102, as generally indicated at 122, or surrounding an interior area 124 within the sensitive circuit area, as generally indicated at 126, when the clam shell 128 is mounted to the circuit board 100. It will, of course, be understood that a circuit board 100 having opposed ground planes 108 with a design similar to that shown in FIGS. 4A and 4B may be enclosed by a clam shell shield 128 having only a peripheral wall 134 as shown in FIG. 1A. Thus, it is not required that each interior portion of the opposed ground planes 108 (as generally indicated at 122 and 126) have a corresponding, aligned interior wall 142 in the clam shell shield 128. The portions of the opposed ground planes surrounding the sensitive area 102, however, must have a corresponding, aligned peripheral wall 134 on the clam shell 128 to efficiently and effectively inhibit the through the air propagation of interference energy between the sensitive area 102 and non-sensitive area 104.

Referring now again to FIGS. 1A and 4A, the isolation effects provided by the opposed tied ground planes 108 and clam shell shield 128 may be enhanced through the use of a flexible partially conductive gasket 144. The gasket 144 is positioned between each half (130 or 132) of the clam shell shield 128 and the surface 110 of the circuit board 100. If interior walls 142 are included in a clam shell 128 half, then the gasket may conform to the shape of the peripheral walls 134 and interior walls, as shown in FIG. 4A, to assist in the isolation provided by the interior walls of the clam shell and opposed ground planes 108 that either divide the sensitive area 102 or surround an area 124 within the sensitive area.

A channel 146, formed in the base 148 of the peripheral and interior walls, 134 and 142, respectively, of each clam shell half, is provided to seat the gasket 144 when the clam shell 128 is attached to the circuit board 100. The gasket 144 is comprised of an elastic rubber based material impregnated with silver particles and an anti-oxidizing agent having any desired cross-sectional shape including circular, as in FIG. 1A, and rectangular, as in FIG. 4A. The silver particles within the gasket 144 render the gasket partially conductive to provide an additional electrical connection between the clam shell 128 and the ground plane 108 mounted on the surface 110 of the circuit board 100. Furthermore, use of a gasket 144 between a clam shell 128 half and the surface 110 of the circuit board 100 beneficially inhibits compression of the board typically encountered when the clam shell 128 is attached on either surface of the circuit board.

Although the ground planes 108 and the clam shell 128 alone provide satisfactory isolation on the circuit board 100, the gasket 144, if included, will enhance the isolation effects provided by the present invention. The gasket 144, when used in combination with the clam shell 128 and opposed ground plane 108, provides a tight RF shield between the sensitive and non-sensitive circuit areas, 102 and 104, respectively. The inclusion of conductive gaskets 144 between the opposed ground planes 108 and the clam shell shield 128 has experimentally proven to provide greater than 130 dB of isolation between the sensitive area 102 and non-sensitive area 104 of the circuit board 100.

While the RFI/EMI isolation apparatus of the present invention has been described in connection with several preferred embodiments, the description is not intended to limit the scope of the invention to the particular forms set forth, but on the contrary, is intended to cover such alternatives, modifications and equivalents as may be included within the spirit and scope of the invention as defined by the appended claims.

We claim:

1. Apparatus for isolating a first circuit area from an adjacent second circuit area on a circuit board having a top surface and a bottom surface, comprising:
    a first ground plane substantially covering the top surface surrounding the first circuit area;
    a second ground plane substantially covering the bottom surface opposite from and aligned with the first ground plane surrounding the first circuit area;
    means for electrically connecting the first ground plane to the second ground plane, the electrically connected first and second ground planes inhibiting the propagation of interference energy through the circuit board between the first and second circuit areas; and
    a conductive clam shell shield for inhibiting airborne propagation of interference energy between the first and second circuit areas, the shield mounted above and below the circuit board to enclose the first circuit area.

2. The apparatus for isolating as in claim 1 wherein the means for electrically connecting comprises a plurality of conductors extending through the board between and connected to the first and second ground planes.

3. The apparatus for isolating as in claim 2 wherein the plurality of conductors are selectively positioned with respect to each other.

4. The apparatus for isolating as in claim 1 wherein the conductive clam shell shield comprises:
    an upper half shell having a peripheral wall defining an area having a size and shape to substantially surround the first circuit area, the upper half shell further including a cover mounted to the peripheral wall;
    a lower half shell having a peripheral wall defining an area having a size and shape to substantially surround the first circuit area, the lower half shell further including a cover mounted thereto; and
    means for attaching the upper half shell to the top surface of the circuit board and the lower half shell to the bottom surface of the circuit board to enclose the first circuit area.

5. The apparatus for isolating as in claim 4 wherein the peripheral walls of the upper and lower halves of the conductive clam shell shield as attached to the top and bottom surfaces of the circuit board are sized and shaped to conform with the first and second ground planes, respectively, surrounding the first circuit area.

6. The apparatus for isolating as in claim 4 further including:
    a first partially conductive gasket positioned between the peripheral wall of the upper half of the clam shell shield as attached to the top surface of the circuit board and the first ground plane as covering the top surface of the circuit board; and
    a second partially conductive gasket positioned between the peripheral wall of the lower half of the clam shell shield as attached to the bottom surface of the circuit board and the second ground plane as covering the bottom surface of the circuit board.

7. The apparatus for isolating as in claim 6 wherein each peripheral wall includes a base having a channel therein for seating the partially conductive gasket.

8. The apparatus for isolating as in claim 1 wherein each of the first and second ground planes comprises a strip ground plane surrounding the first circuit area.

9. The apparatus for isolating as in claim 1 wherein the first circuit area includes a sub-area therein and wherein each of the first and second ground planes comprises a planar sheet ground plane covering an area within the first circuit area surrounding the sub-area.

10. Apparatus for isolating a first circuit area from an adjacent second circuit area on a circuit board having a top surface and a bottom surface, comprising:
- a first ground plane substantially covering the top surface surrounding the first circuit area;
- a second ground plane substantially covering the bottom surface opposite from and aligned with the first ground plane surrounding the first circuit area;
- means for electrically connecting the first ground plane to t he second ground plane, the electrically connected first and second ground planes inhibiting the propagation of interference energy through the circuit board between the first and second circuit areas;
- a third ground plane covering the top surface of the board to divide the first circuit area;
- a fourth ground plane covering the bottom surface of the circuit board opposite from and aligned with the third ground plane to divide the first circuit area; and
- means for electrically connecting the third ground plane to the fourth ground plane, the electrically connected third and fourth ground planes inhibiting the propagation of interference energy through the circuit board within the first circuit area.

11. The apparatus for isolating as in claim 10 further including means for electrically connecting the connected third and fourth ground planes to the connected first and second ground planes.

12. The apparatus for isolating as in claim 10 further including a conductive clam shell shield attached to each side of the circuit board for enclosing the first circuit area, the conductive clam shell shield comprising:
- an upper half shell having a peripheral wall defining an area having a size and shape to substantially surround the first circuit area and at least one interior wall dividing the first circuit area, the upper half shell further including a cover mounted to the peripheral wall;
- a lower half shell having a peripheral wall defining an area having a size and shape to substantially surround the first circuit area and at least one interior wall dividing the first circuit area, the lower half shell further including a cover mounted to the peripheral wall; and
- means for attaching the upper half shell to the top surface of the circuit board and the lower half shell to the bottom surface of the circuit board whereby the peripheral walls of the upper and lower halves are sized and shaped to conform with the first and second ground planes, respectively, and the interior walls of the upper and lower halves are sized and shaped to conform with the third and fourth ground planes, respectively.

13. Apparatus for isolating a first circuit area from an adjacent second circuit area on a circuit board having a top surface and a bottom surface, comprising:
- a first ground plane substantially covering the top surface surrounding the first circuit area;
- a second ground plane substantially covering the bottom surface opposite from and aligned with the first ground plane surrounding the first circuit area;
- means for electrically connecting the first ground plane to the second ground plane, the electrically connected first and second ground planes inhibiting the propagation of interference energy through the circuit board between the first and second circuit areas;
- a third ground plane covering the top surface of the board to surround a third circuit area within the first circuit area;
- a fourth ground plane covering the bottom surface of the circuit board opposite from and aligned with the third ground plane to surround the third circuit area; and
- means for electrically connecting the third ground plane to the fourth ground plane, the electrically connected third and fourth ground planes inhibiting the propagation of interference energy through the circuit board within the first circuit area.

14. The apparatus for isolating as in claim 13 further including means for electrically connecting the connected third and fourth ground planes to the connected first and second ground planes.

15. The apparatus for isolating as in claim 13 further including a conductive clam shell shield attached to each side of the circuit board for enclosing the first circuit area, the conductive clam shell shield comprising:
- an upper half shell having a peripheral wall defining an area having a size and shape to substantially surround the first circuit area and an interior wall defining an area having a size and shape to substantially surround the third circuit area, the upper half shell further including a cover mounted to the peripheral wall;
- a lower half shell having a peripheral wall defining an area having a size and shape to substantially surround the first circuit area and an interior wall defining an area having a size and shape to substantially surround the third circuit area, the lower half shell further including a cover mounted to the peripheral wall; and
- means for attaching the upper half shell to the top surface of the circuit board and the lower half shell to the bottom surface of the circuit board whereby the peripheral walls of the upper and lower halves are sized and shaped to conform with the first and second ground planes, respectively, and the interior walls of the upper and lower halves are sized and shaped to conform with the third and fourth ground planes, respectively.

16. Apparatus for providing interference isolation on a circuit board having a top surface and a bottom surface, the circuit board further having an adjacent first circuit area and second circuit area identified thereon, comprising:
- a first set of opposed interconnected ground planes for inhibiting the propagation of interference energy through the circuit board between the first and second circuit areas, comprising:
  - a first conductor on the top surface of the circuit board surrounding the first circuit area;
  - a second conductor on the bottom surface of the circuit board aligned with first conductor;
  - a plurality of selectively spaced conductors extending through the circuit board connected to and between the first and second conductors; and
- a conductive clam shell enclosure shield for inhibiting the airborne propagation of interference energy between the first and second circuit areas, comprising:
  - an upper half shell having a cover and a peripheral wall mounted thereto, the peripheral wall defining an area sized and shaped to substantially conform to the size and shape of the first circuit area, the upper half shell attached to the top surface of the circuit board so that the position of the peripheral wall substantially coincides with the position of the first conductor surrounding the first circuit area; and a lower half shell having a cover and a peripheral wall mounted thereto, the peripheral wall defining an area sized and shaped to substantially conform to the size and shape of the first circuit area, the lower half shell attached to the bottom surface of the circuit board so that the position of the peripheral wall substantially coincides with the position of the second conductor surrounding the first circuit area.

17. The apparatus for providing interference isolation as in claim 16 further comprising:

a first conductive gasket positioned between the peripheral wall of the upper half of the clam shell attached to the top surface of the circuit board and the first conductor on the top surface of the circuit board; and a second conductive gasket positioned between the peripheral wall of the lower half of the clam shell attached to the bottom surface of the circuit board and the second conductor on the bottom surface of the circuit board.

18. The apparatus for providing interference isolation as in claim 16 wherein the first circuit area includes a first and a second sub-areas identified therein, the apparatus further comprising a second set of opposed interconnected ground planes for inhibiting the propagation of interference energy through the circuit board between the first and second sub-areas, comprising:

a third conductor on the top surface of the circuit board separating the first sub-area from the second sub-area;

a fourth conductor on the bottom surface of the circuit board aligned with third conductor; and a plurality of selectively spaced conductors extending through the circuit board connected to and between the third and fourth conductors.

19. The apparatus for providing interference isolation as in claim 18 further comprising means for electrically connecting the connected first and second conductors to the connected third and fourth conductors.

20. The apparatus for providing interference isolation as in claim 18:

wherein the upper half shell further includes an interior wall mounted therein and positioned to coincide with the positioned third conductor when the upper half shell is mounted to the top surface; and wherein the lower half shell further includes an interior wall mounted therein and positioned to coincide with the position of the fourth conductor when the lower half shell is mounted to the bottom surface.

21. The apparatus for providing interference isolation as in claim 16 wherein the first and second conductors comprise linear conductive strips.

22. The apparatus for providing interference isolation as in claim 16 wherein the first and second conductors comprise planar conductive sheets.

* * * * *